(12) United States Patent
Wang et al.

(10) Patent No.: US 7,598,779 B1
(45) Date of Patent: Oct. 6, 2009

(54) DUAL-MODE LVDS/CML TRANSMITTER METHODS AND APPARATUS

(75) Inventors: Shoujun Wang, Kanata (CA); Yuming Tao, Kanata (CA); William Bereza, Nepean (CA); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/962,137

(22) Filed: Oct. 8, 2004

(51) Int. Cl.
*H03K 3/00* (2006.01)
(52) U.S. Cl. ...................................... 327/108; 327/112
(58) Field of Classification Search ........................ None
See application file for complete search history.

(56) References Cited

U.S. PATENT DOCUMENTS

| | | | |
|---|---|---|---|
| 3,473,160 A | 10/1969 | Wahlstrom | |
| 3,633,120 A | 1/1972 | Battjes | |
| 4,333,058 A | 6/1982 | Hoover | |
| 4,527,079 A | 7/1985 | Thompson | |
| 4,658,156 A | 4/1987 | Hashimoto | |
| 4,723,110 A | 2/1988 | Voorman | |
| 4,797,631 A | 1/1989 | Hsu et al. | |
| 4,853,560 A | 8/1989 | Iwamura et al. | |
| 5,059,835 A | 10/1991 | Lauffer et al. | |
| 5,067,007 A | 11/1991 | Otsuka et al. | |
| 5,144,167 A | 9/1992 | McClintock | |
| RE34,808 E | 12/1994 | Hsieh | |
| 5,420,538 A | 5/1995 | Brown | |
| 5,491,455 A | 2/1996 | Kuo | |
| 5,521,530 A | 5/1996 | Yao et al. | |
| 5,557,219 A | 9/1996 | Norwood et al. | |
| 5,589,783 A | 12/1996 | McClure | |
| 5,668,468 A * | 9/1997 | Cargill | 323/316 |
| 5,689,195 A | 11/1997 | Cliff et al. | |
| 5,742,178 A | 4/1998 | Jenkins, IV et al. | |
| 5,764,086 A | 6/1998 | Nagamatsu et al. | |
| 5,801,548 A | 9/1998 | Lee et al. | |
| 5,936,423 A | 8/1999 | Sakuma et al. | |
| 5,939,904 A * | 8/1999 | Fetterman et al. | 327/67 |
| 5,958,026 A | 9/1999 | Goetting et al. | |
| 5,970,255 A | 10/1999 | Tran et al. | |

(Continued)

FOREIGN PATENT DOCUMENTS

EP      0 575 124      5/2001

OTHER PUBLICATIONS

U.S. Appl. No. 10/652,521, filed Aug. 29, 2003, Zaliznyak et al.

(Continued)

*Primary Examiner*—Tuan Lam
*Assistant Examiner*—Hiep Nguyen
(74) *Attorney, Agent, or Firm*—Ropes & Gray LLP; Robert R. Jackson; Chia-Hao La (57) ABSTRACT

A dual-mode LVDS/CML transmitter allows a single circuit to operate as either an LVDS transmitter or a CML transmitter. The transmitter mode can be switched by activating or deactivating appropriate circuit elements, and changing the voltage or current produced by appropriate sources or sinks. This flexibility allows a single transmitter to operate well in both AC and DC coupling conditions, and facilitates interoperation with a greater variety of receivers.

24 Claims, 8 Drawing Sheets

U.S. PATENT DOCUMENTS

| | | | |
|---|---|---|---|
| 6,040,712 | A | 3/2000 | Mejia |
| 6,107,859 | A * | 8/2000 | Moyal ........................ 327/355 |
| 6,175,952 | B1 | 1/2001 | Patel et al. |
| 6,215,326 | B1 | 4/2001 | Jefferson et al. |
| 6,236,231 | B1 | 5/2001 | Nguyen et al. |
| 6,252,419 | B1 | 6/2001 | Sung et al. |
| 6,281,715 | B1 | 8/2001 | DeClue et al. |
| 6,288,581 | B1 | 9/2001 | Wong |
| 6,373,278 | B1 | 4/2002 | Sung et al. |
| 6,377,076 | B1 | 4/2002 | Gauthier |
| 6,433,579 | B1 | 8/2002 | Wang et al. |
| 6,566,915 | B1 * | 5/2003 | Krupnik et al. ............... 327/58 |
| 6,603,348 | B1 * | 8/2003 | Preuss et al. ................ 327/563 |
| 6,650,140 | B2 | 11/2003 | Lee et al. |
| 6,724,328 | B1 | 4/2004 | Lui et al. |
| 6,731,135 | B2 * | 5/2004 | Brunolli ...................... 326/83 |
| 6,854,044 | B1 | 2/2005 | Venkata et al. |
| 6,940,302 | B1 | 9/2005 | Shumarayev et al. |
| 6,943,588 | B1 * | 9/2005 | Luo et al. ..................... 326/86 |
| 6,956,407 | B2 | 10/2005 | Baig et al. |
| 7,024,464 | B1 * | 4/2006 | Lusher et al. ............... 709/219 |
| 7,417,460 | B2 * | 8/2008 | De Laurentiis et al. ........ 326/82 |
| 2003/0052709 | A1 | 3/2003 | Venkata et al. |
| 2003/0141919 | A1 | 7/2003 | Wang et al. |
| 2004/0140837 | A1 | 7/2004 | Venkata et al. |
| 2005/0095988 | A1 | 5/2005 | Bereza et al. |
| 2005/0160327 | A1 | 7/2005 | Baig et al. |

OTHER PUBLICATIONS

U.S. Appl. No. 10/756,949, filed Jan. 13, 2004, Kwasniewski et al.

U.S. Appl. No. 10/937,518, filed Sep. 8, 2004, Wang et al.

B. Gilbert, "The Multi-Tahn Principle: A Tutorial Overview" IEEE Journal of Solid-State Circuits, vol. 33, No. 1, Jan. 1998.

K. Farzan, "A CMOS 10-Gb/s Power-Efficient 4-PAM Transmitter," IEEE Journal of Solid-State Circuits, vol. 39, No. 3, Mar. 2004, pp. 529-532.

"LVDS Owner's Manual: Design Guide," National Semiconductor Corporation, Spring 1997, Chapter 1, pp. 1-7.

"ORCA Series 3 Field-Programmable Gate Arrays, Preliminary Data Sheet, Rev. 01," Lucent Technologies Inc., Microelectronics Group, Allentown, PA, Aug. 1998, pp. 1-80.

"Optimized Reconfigurable Cell Array (ORCA), OR3Cxxx/OR3Txxx Series Field-Programmable Gate Arrays, Preliminary Product Brief," Lucent Technologies Inc., Microelectronics Group, Allentown, PA, Nov. 1997, pp. 1-7 and unnumbered back cover.

Patel, R. et al., "A 3.3-V Programmable Logic Device that Addresses Low Power Supply and Interface Trends," *IEEE 1997 Custom Integrated Circuits Conference*, May 1997, pp. 539-542.

"Using Phase Locked Loop (PLLs) in DL6035 Devices, Application Note," Dyna Chip Corporation, Sunnyvale, CA, 1998, pp. i and 1-6.

"Using the Virtex Delay-Locked Loop, Application Note, XAPP132, Oct. 21, 1998 (Version 1.31)," Xilinx Corporation, Oct. 21, 1998, pp. 1-14.

"Virtex 2.5V Field Programmable Gate Arrays, Advanced Product Specification, Oct. 20, 1998 (Version 1.0)," Xilinx Corporation, Oct. 20, 1998, pp. 1-24.

"DY6000 Family, Fast Field Programmable Gate Array, DY6000 Family Datasheet," Dyna Chip Corporation, Sunnyvale, CA, Dec. 1998, pp. 1-66.

* cited by examiner

|  | Common-Mode Voltage | | Maximum Achievable Swing | | Power Supply Requirement | | Self-Loading | Area | Power |
|---|---|---|---|---|---|---|---|---|---|
|  | AC | DC | AC | DC | AC | DC | | | |
| LVDS | $\frac{Vdd}{2}$ | $\frac{Vdd}{2}$ | Vdd-2Vh | Vdd-2Vh | Vswing +2Vh | Vswing +2Vh | ~3.5x | ~3.5x | 1x |
| CML | Vdd- Vswing | Vdd- $\frac{Vswing}{2}$ | $\frac{2}{3}$(Vdd- Vh) | Vdd-Vh | $\frac{3}{2}$ Vswing +Vh | Vswing +Vh | 2x | 2x | 2x |

DUAL-MODE LVDS/CML TRANSMITTER METHODS AND APPARATUS

BACKGROUND OF THE INVENTION

Low Voltage Differential Signaling (LVDS) and Current Mode Logic (CML) are two standards commonly used for differential signal transmission. These standards are especially common in the field of high-speed serial (HSS) interfaces. Each standard has its own advantages and disadvantages, making it better suited for either alternating current (AC) coupling or direct current (DC) coupling.

The performance of an LVDS or CML transmitter is characterized by several attributes, including its common-mode voltage, maximum achievable voltage swing, and power supply requirement. Common-mode voltage is the bias point about which the transmitter's output voltage varies, and is defined as the average of the high signal voltage (Vhigh) and the low signal voltage (Vlow). Maximum achievable voltage swing is the greatest amount by which Vhigh can differ from Vlow while keeping all transmitter devices in saturation. Finally, power supply requirement is the minimum power supply voltage (Vdd) that can be used with the transmitter, and is often expressed in terms of the voltage swing. Other considerations, such as the area occupied by the transmitter circuit, are discussed later.

LVDS transmitters tend to be more well-suited to AC coupling than CML transmitters. Under AC coupling conditions, an LVDS transmitter will often permit a higher voltage swing and a lower power supply voltage than a CML transmitter. Although LVDS transmitters tend to have a lower common-mode voltage under these conditions, a high common-mode voltage is not essential to AC coupling.

In contrast, CML transmitters tend to be more well-suited to DC coupling than LVDS transmitters. Under DC coupling conditions, a CML transmitter will usually allow a higher voltage swing, a lower power supply voltage, and a higher common-mode voltage than an LVDS transmitter.

In view of the foregoing, it would be desirable to combine the benefits of LVDS AC transmission with the benefits of CML DC transmission in a single transmitter circuit. Furthermore, it would be desirable to make switching between the two transmission modes relatively simple.

SUMMARY OF THE INVENTION

In accordance with this invention, circuitry and methods are provided for a dual-mode LVDS/CML transmitter. The transmitter is similar in structure to a standard LVDS transmitter. In an exemplary embodiment, the transmitter includes a variable voltage source and a variable current sink.

Under AC coupling conditions, the transmitter is configured such that all circuit elements are activated, an appropriate voltage is produced by the variable voltage source, and an appropriate current is produced by the variable current sink. This configuration emulates an LVDS transmitter, potentially providing a higher voltage swing and a lower power supply voltage when performing AC coupling.

Under DC coupling conditions, two transistors are deactivated, which in turn disables a fixed current source. Also, the voltage produced by the variable voltage source and the current produced by the variable current sink are modified as necessary. This configuration emulates a CML transmitter, potentially providing a higher common-mode voltage, a higher voltage swing, and a lower power supply voltage when performing DC coupling.

The invention therefore advantageously combines the benefits of LVDS transmission and CML transmission into a single transmitter circuit. Greater flexibility is provided, as the transmitter can perform well under both AC coupling and DC coupling conditions.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1A:
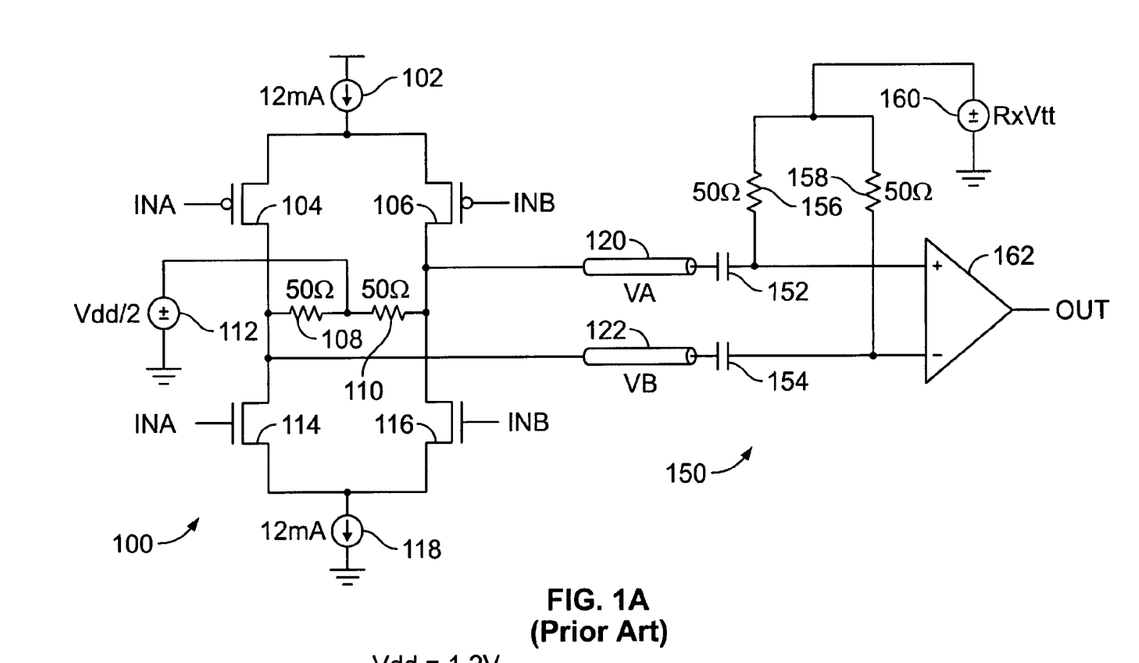
FIG. 1A is a circuit diagram of an illustrative LVDS transmitter and an illustrative receiver, operating under AC coupling conditions.

FIG. 1A shows an illustrative LVDS transmitter 100 and an illustrative receiver 150, operating in AC coupling conditions. Transmitter 100 includes current source 102, PMOS transistors 104 and 106, resistors 108 and 110, voltage source 112, NMOS transistors 114 and 116, and current sink 118. Receiver 150 includes capacitors 152 and 154, resistors 156 and 158, voltage source 160, and amplifier 162. Transmitter 100 and receiver 150 are connected by wires 120 and 122. Differential voltage inputs INA and INB are applied to transistors 104, 106, 114, and 116 as indicated. Since INA and INB have different voltage levels, only two operating scenarios are possible.

In one scenario, INA is a relatively high voltage while INB is a relatively low voltage. For purposes of illustration, suppose Vdd is approximately 1.2V, GND is approximately 0V, current source 102 and current sink 118 produce currents of about 12 mA, resistors 108, 110, 156, and 158 have resistances of about 50 ohms, voltage source 112 produces a transmission voltage of about Vdd/2 (0.6V), and voltage source 160 produces a receiver voltage of RxVtt. Because INA is relatively high, PMOS transistor 104 will be off while NMOS transistor 114 will be on. Likewise, because INB is relatively low, PMOS transistor 106 will be on while NMOS transistor 116 will be off. Therefore, current will flow from current source 102 through PMOS transistor 106, through resistors 110 and 108, through NMOS transistor 114, and into current sink 118.

In this example, about 12 mA of current flows through PMOS transistor 106. Suppose capacitors 152 and 154 are relatively large, and voltages VA and VB vary with a relatively high frequency. Under these conditions, capacitors 152 and 154 behave substantially like short circuits, and the load seen through wire 120, resistors 156 and 158, and wire 122 is substantially equal to the load seen through the path with resistors 110 and 108. As a result, the current will be split almost equally among the two paths. Therefore, about 6 mA of current will flow through resistors 110 and 108, producing approximately a 0.3V voltage drop through each resistor. Since the junction of resistors 108 and 110 is biased to 0.6V by voltage source 112, VA will have a value of approximately 0.9V and VB will have a value of approximately 0.3V. The two current paths described above converge at the drain of NMOS transistor 114, through which approximately 12 mA of current flows.

Figure 1B:
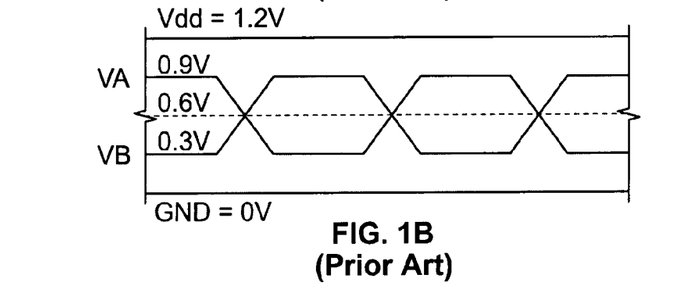
FIG. 1B is a waveform showing illustrative voltage levels for the circuits of FIG. 1A.

In the second scenario, INA is a relatively low voltage while INB is a relatively high voltage. Under these conditions, current flows through PMOS transistor 104 and NMOS transistor 116, resulting in a VA of about 0.3V and a VB of about 0.9V. FIG. 1B shows illustrative values of VA and VB, switching between the two scenarios described above. The common-mode voltage of about 0.6V is set by voltage source 112. Because receiver 150 has a configurable receiver voltage RxVtt, the receiver can be biased as appropriate, and VA and VB do not have to satisfy any common-mode voltage requirements. In contrast, DC coupling requires a relatively high common-mode voltage, as described below.

Figure 2A:
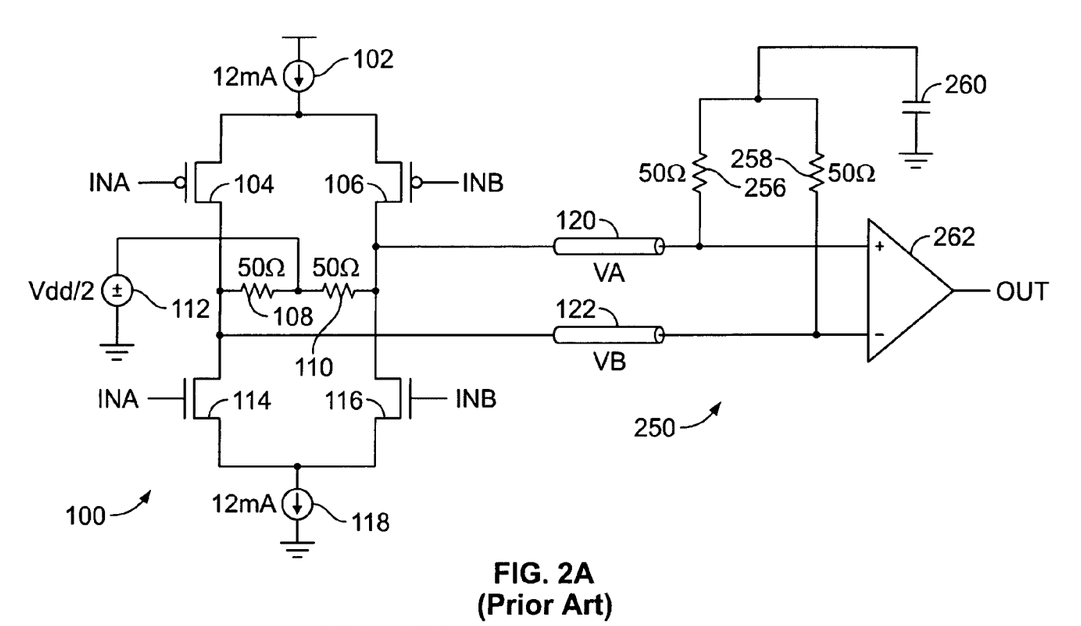
FIG. 2A is a circuit diagram of an illustrative LVDS transmitter and an illustrative receiver, operating under DC coupling conditions.

FIG. 2A shows LVDS transmitter 100 from FIG. 1A and an illustrative receiver 250, operating in DC coupling conditions. Receiver 250 includes resistors 256 and 258, capacitor 260, and amplifier 262. Transmitter 100 operates as described in connection with FIG. 1A. However, note that there are two differences between AC receiver 150 and DC receiver 250, which are discussed below.

First, receiver 250 does not use DC blocking capacitors at the far ends of wires 120 and 122, since it is not necessary or desirable to filter out low frequency signals when performing DC coupling. Omitting the DC blocking capacitors can save valuable area on the integrated circuit, since capacitors are discrete components. Removing the DC blocking capacitors also allows signals VA and VB to be transmitted using any desirable encoding, including encodings with a potentially long run length. Second, because the capacitors have been removed, transmitter 200 and receiver 250 can no longer have independent voltage biasing. Thus, the receiver voltage source has been replaced with capacitor 260, which provides a ground path for high frequency common-mode noise.

Figure 2B:
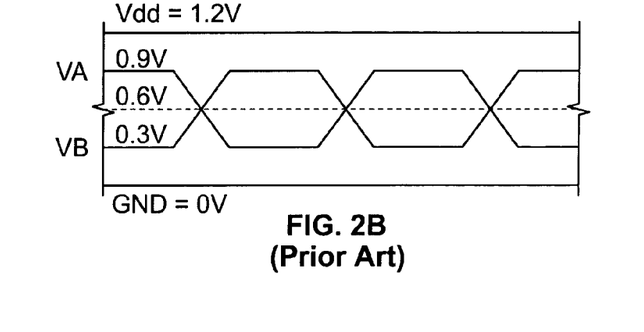
FIG. 2B is a waveform showing illustrative voltage levels for the circuits of FIG. 2A.

The lack of independent receiver voltage biasing makes the transmitter's common-mode voltage significant. As shown in FIG. 2B, voltages VA and VB switch between about 0.9V and about 0.3V, corresponding to a common-mode voltage of approximately (0.9V+0.3V)/2, or 0.6V. Many receivers require a higher common-mode voltage for optimal operation. For example, in an NMOS differential amplifier receiver such as receiver 250, a common-mode voltage of approximately 0.9V might be preferred. Moreover, LVDS transmitter 100 may be incompatible with a receiver that uses a high receiver termination voltage, such as Vdd (about 1.2V in the examples discussed). Therefore, LVDS transmitters are sometimes a sub-optimal choice for DC coupling.

Figure 3A:
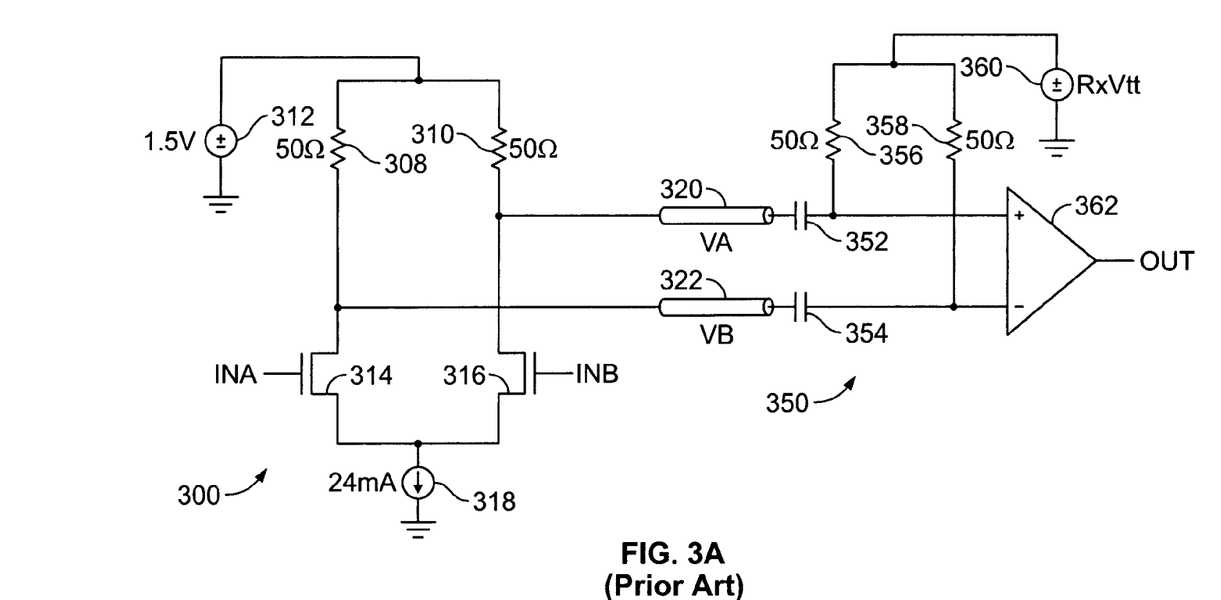
FIG. 3A is a circuit diagram of an illustrative CML transmitter and an illustrative receiver, operating under AC coupling conditions.

In contrast, CML transmitters can exhibit very different operating characteristics. FIG. 3A shows an illustrative CML transmitter 300 and an illustrative receiver 350, operating in AC coupling conditions. Transmitter 300 includes resistors 308 and 310, voltage source 312, NMOS transistors 314 and 316, and current sink 318. Receiver 350 includes capacitors 352 and 354, resistors 356 and 358, voltage source 360, and amplifier 362. Transmitter 300 and receiver 350 are connected by wires 320 and 322. Voltage inputs INA and INB are applied to the gates of transistors 314 and 316, as shown. Since INA and INB have different values, only two operating scenarios are possible.

In one scenario, INA is a relatively high voltage while INB is a relatively low voltage. For purposes of illustration, suppose Vdd is approximately 1.5V, GND is approximately 0V, current sink 318 produces a current of about 24 mA, resistors 308, 310, 356, and 358 have resistances of about 50 ohms, voltage source 312 produces a transmission voltage of about 1.5V, and voltage source 360 produces a receiver voltage of RxVtt. Because INA is relatively high and INB is relatively low, NMOS transistor 314 will be on and NMOS transistor 316 will be off. Therefore, current will flow from voltage source 312, through resistor 308 and NMOS transistor 314, and into current sink 318.

In this example, about 24 mA of current enters current sink 318. This current comes from two sources, namely the path through resistor 308 described above and the path through receiver resistor 358. Suppose capacitors 352 and 354 are relatively large, and voltages VA and VB vary with a relatively high frequency. Under these conditions, capacitors 352 and 354 behave substantially like short circuits and the resistances are substantially identical (about 50 ohms in this example). As a result, approximately 12 mA of current will flow through each, resulting in a voltage swing of about 0.6V.

In contrast to an LVDS transmitter, whose common-mode voltage is set by an independent voltage source, the common-mode voltage of a CML transmitter is self-biased. During initial operation (e.g., power-up), there is a transient process during which capacitors 352 and 354 are charged from their initial voltages to final or steady-state voltages. The final voltage on the receiver side is defined by RxVtt, while the final voltage on the transmitter side is determined by Vdd and the voltage swing. One of ordinary skill in the art can calculate the common-mode voltage to be approximately 0.9V in this scenario. Once the transient process has settled, the common-mode voltage remains substantially unchanged as long as signals VA and VB are DC-balanced (i.e., they carry substantially equal numbers of ones and zeros), which is a common requirement for AC coupling. Since the voltage swing is approximately 0.6V under high frequency conditions, VA and VB will switch between about 1.2V and about 0.6V.

Figure 3B:
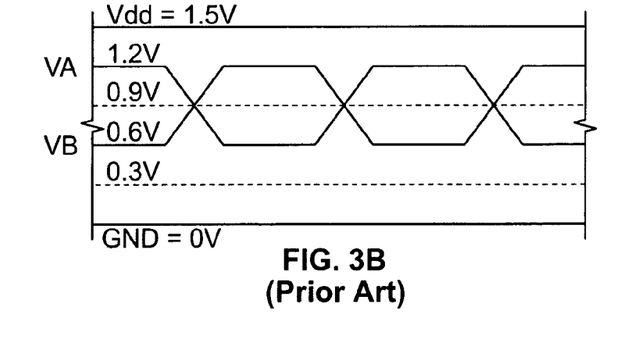
FIG. 3B is a waveform showing illustrative voltage levels for the circuits of FIG. 3A.

In the second scenario, INA is a relatively low voltage while INB is a relatively high voltage. Under these conditions, current flows through resistor 310 and NMOS transistor 316, resulting in a VA of about 0.6V and a VB of about 1.2V. FIG. 3B shows illustrative values of VA and VB, switching between the two scenarios described above. The common-mode voltage is shown as a dashed line at approximately 0.9V, along with corresponding signal voltages of about 1.2V and about 0.6V.

Note that the high signal voltage Vhigh (1.2V) does not reach Vdd (1.5V). Thus, CML transmitter 300 operating under AC coupling conditions requires a relatively high Vdd (1.5V) to achieve the same common-mode voltage (0.9V) and voltage swing (0.6V) as the same CML transmitter operating under DC coupling conditions. This relatively high power supply voltage results in increased power consumption, which may make CML transmitters a sub-optimal choice for AC coupling.

Figure 4A:
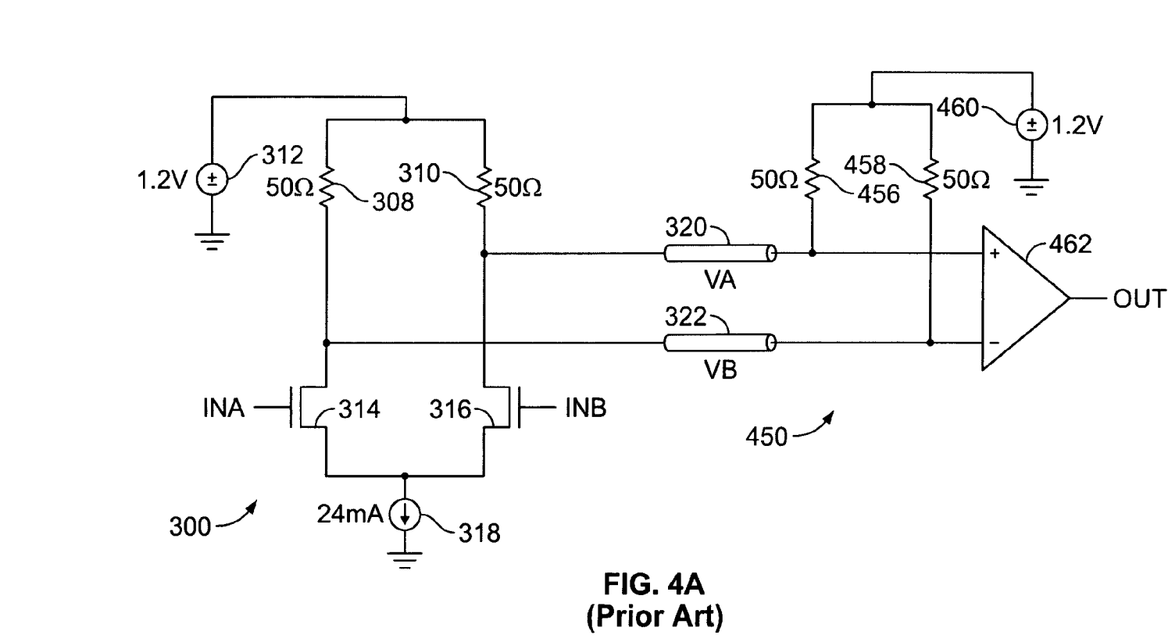
FIG. 4A is a circuit diagram of an illustrative CML transmitter and an illustrative receiver, operating under DC coupling conditions.

FIG. 4A shows CML transmitter 300 from FIG. 3A and an illustrative receiver 450, operating in DC coupling conditions. Receiver 450 includes resistors 456 and 458, voltage source 460, and amplifier 462. Note that there are two differences between AC receiver 350 and DC receiver 450, which are discussed below.

First, receiver 450 does not use DC blocking capacitors at the far ends of wires 320 and 322, since it is not necessary or desirable to filter out low frequency signals when performing DC coupling. Omitting the DC blocking capacitors can save valuable area on the integrated circuit, since capacitors are discrete components. Removing the DC blocking capacitors also allows signals VA and VB to be transmitted using any desirable encoding, including encodings with a potentially long run length. Second, because the capacitors have been removed, transmitter 300 and receiver 450 can no longer have independent voltage biasing. Thus, the receiver voltage source has been replaced with voltage supply 460, which matches transmitter voltage source 312.

Because there are no DC blocking capacitors in receiver 450, resistors 308 and 458 (or similarly, resistors 310 and 456) will be connected in parallel, resulting in an effective resistance of about 25 ohms. Since current sink 318 generates about 24 mA of current, that creates an approximate voltage drop of 0.6V across resistor 308 (or similarly, resistor 310). Thus, VA and VB can take values of about 1.2V or about 0.6V, depending on the values of INA and INB.

Figure 4B:
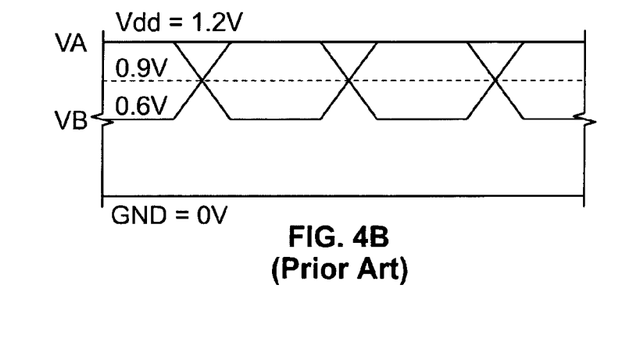
FIG. 4B is a waveform showing illustrative voltage levels for the circuit of FIG. 4A.

The lack of independent receiver voltage biasing makes the transmitter's common-mode voltage significant. As shown in FIG. 4B, voltages VA and VB switch between about 1.2V and about 0.6V, resulting in a common-mode voltage of approximately (1.2V+0.6V)/2, or 0.9V. This relatively high common-mode voltage ensures correct receiver operation, making CML transmitters very well suited for DC coupling.

Figure 5:
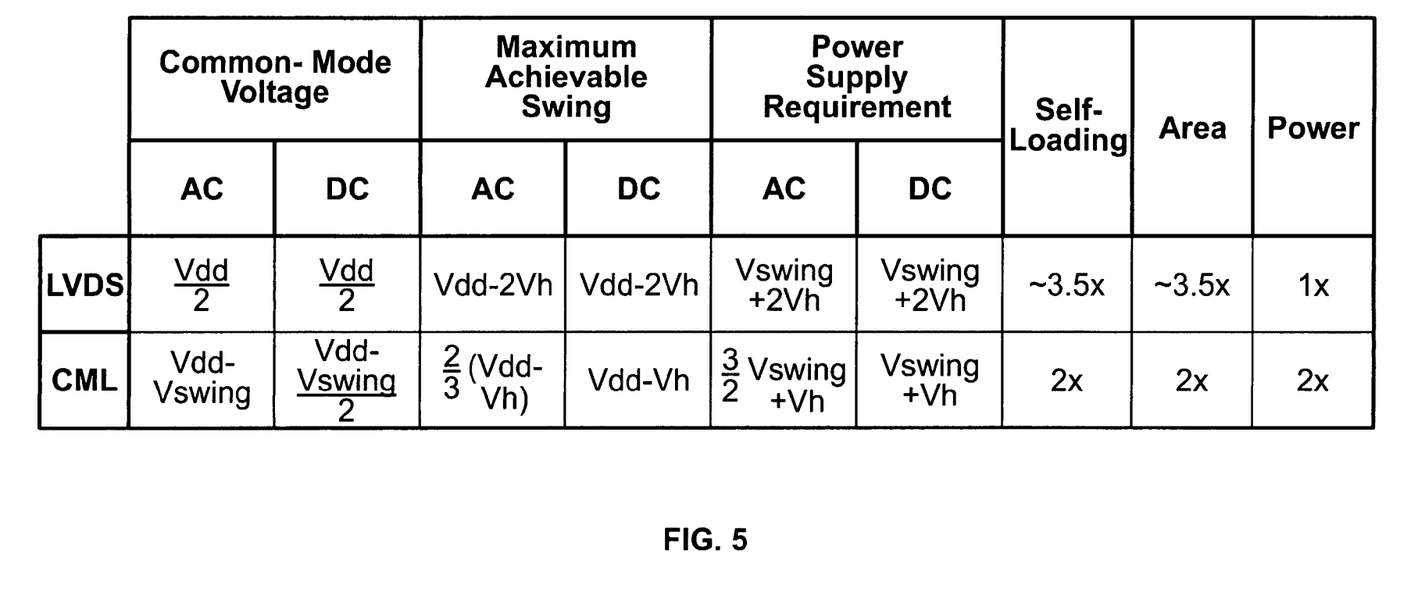
FIG. 5 is a table comparing the performance of illustrative LVDS and CML transmitters under AC and DC coupling conditions.

FIG. 5 is a table summarizing various properties of LVDS and CML transmitters operating in both AC and DC coupling conditions. In this table, Vh is the headroom voltage, which is defined as Vds+Vdssat. Vds is the drain-to-source voltage on the transistors accepting INA and INB as inputs. Vdssat is the drain-to-source saturation voltage of the devices in the current sink and, if applicable, the current source.

As shown in the table, an LVDS transmitter often has advantages under AC coupling conditions. In particular, LVDS can achieve a higher voltage swing when Vdd−2*Vh>(2/3)(Vdd−Vh), or when Vdd>4*Vh, which is often the case with current fabrication technology. In addition, an LVDS transmitter requires a lower power supply voltage than a CML transmitter when Vswing+2*Vh<(3/2)Vswing+Vh, or when Vh<Vswing/2, which again is often the case when Vswing is relatively high.

In contrast, CML tends to be advantageous under DC coupling conditions. Specifically, CML has a higher common-mode voltage when Vdd−Vswing/2>Vdd/2, or when Vdd>Vswing, which is always true. Also, CML can achieve a higher voltage swing (Vdd−Vh>Vdd−2*Vh) and a lower power supply voltage (Vswing+Vh<Vswing+2*Vh).

Although not discussed in detail herein, there are additional properties that distinguish the performance of LVDS and CML transmitters, such as self-loading (which reduces speed), area occupied by the transmitter circuit, and circuit power consumption. As shown in FIG. 5, while an LVDS transmitter can consume about half the power of a CML transmitter, it can also occupy more area and experience a greater degree of self-loading.

Figure 6A:
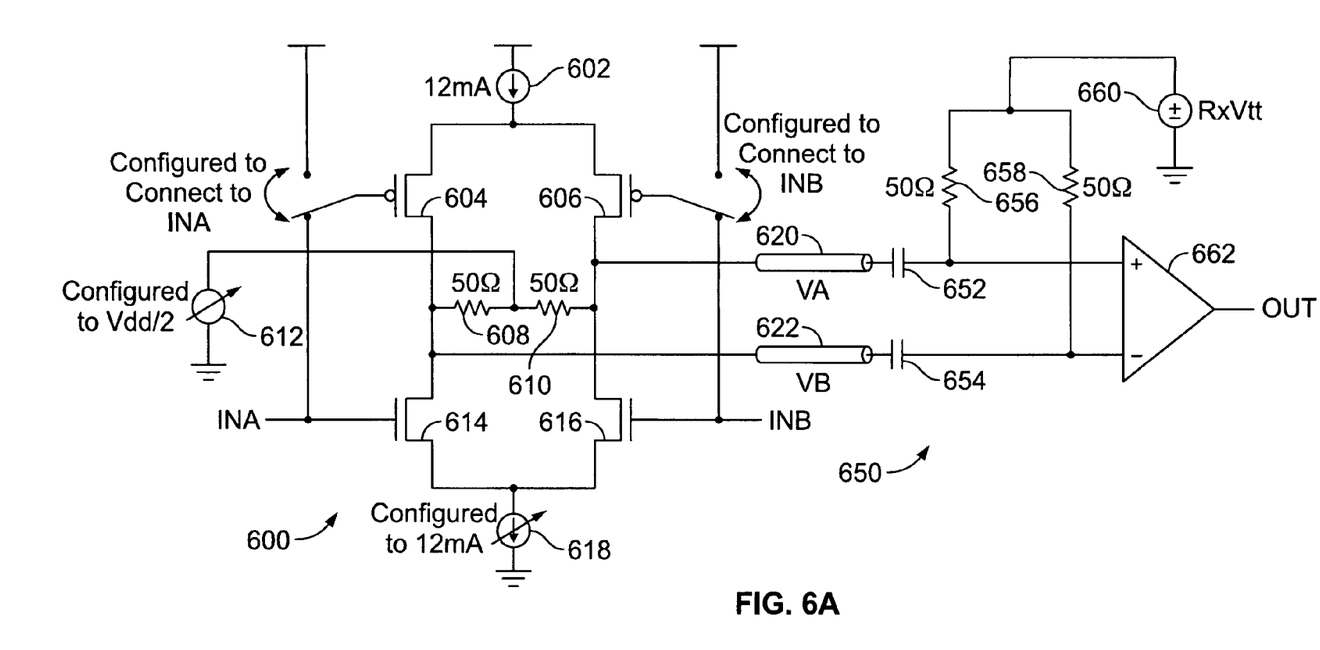
FIG. 6A is a circuit diagram of an illustrative dual-mode LVDS/CML transmitter according to the invention and an illustrative receiver, operating under AC coupling conditions.

Thus, LVDS transmitters are generally well suited to AC coupling and CML transmitters are generally well suited to DC coupling. In view of these observations, it would be desirable to develop a single transmitter that could perform AC coupling using LVDS, and perform DC coupling using CML. FIG. 6A shows a dual-mode LVDS/CML transmitter 600 in accordance with the invention and an illustrative receiver 650, operating in AC coupling conditions. Dual-mode LVDS/CML transmitter 600 includes current source 602, PMOS transistors 604 and 606, resistors 608 and 610, variable voltage source 612, NMOS transistors 614 and 616, and variable current sink 618. Receiver 650 includes capacitors 652 and 654, resistors 656 and 658, voltage, source 660, and amplifier 662. Transmitter 600 and receiver 650 are connected by wires 620 and 622.

Figure 6B:
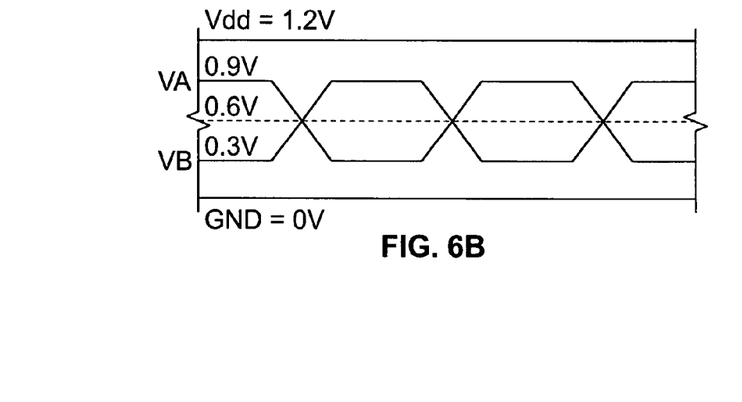
FIG. 6B is a waveform showing illustrative voltage levels for the circuits of FIG. 6A.

In this configuration, transmitter 600 behaves substantially like LVDS transmitter 100. Voltage signals VA and VB switch between approximately 0.9V and approximately 0.3V, as shown in FIG. 6B. A common-mode voltage of about 0.6V is maintained. Effective operation is achieved without having to use a power supply of about 1.5V, which was necessary with CML transmitter 300. Also, transmitter 600 can achieve a relatively high voltage swing with the configuration shown in FIG. 6A. Therefore, transmitter 600, configured as shown in FIGS. 6A and 6B, is well suited to AC coupling.

Figure 7A:
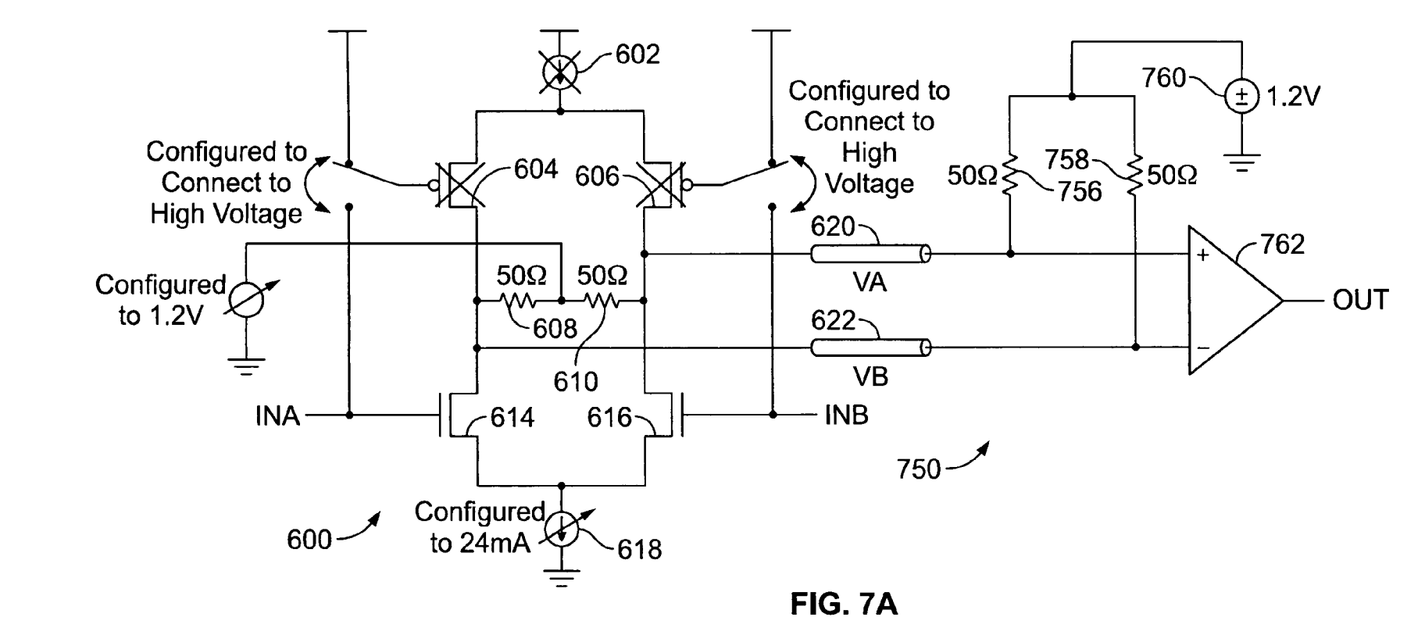
FIG. 7A is a circuit diagram of an illustrative dual-mode LVDS/CML transmitter according to the invention and an illustrative receiver, operating under DC coupling conditions.

FIG. 7A shows dual-mode LVDS/CML transmitter 600 from FIG. 6A and an illustrative receiver 750, operating in DC coupling conditions. Receiver 750 includes resistors 756 and 758, voltage source 760, and amplifier 762. Note that transmitter 600 is configured differently in FIG. 7A than in FIG. 6A. PMOS transistors 604 and 606 have been rendered inactive, e.g., by applying relatively high voltages to their gates. Since PMOS transistors 604 and 606 are no longer conducting, current source 602 does not send any current through transmitter 600, and is also rendered inactive. Variable voltage source 612 has been set to generate about 1.2V of voltage, and variable current sink 618 has been set to generate about 24 mA of current.

Figure 7B:
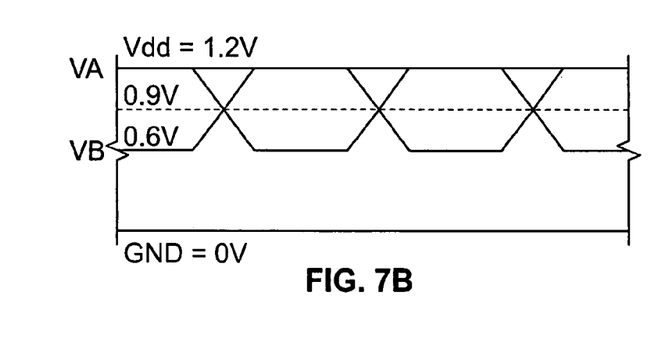
FIG. 7B is a waveform showing illustrative voltage levels for the circuit of FIG. 7A.

In this configuration, transmitter 600 behaves substantially like CML transmitter 300. Voltage signals VA and VB switch between approximately 1.2V (Vdd) and approximately 0.6V, as shown in FIG. 7B. Thus, a common-mode voltage of (1.2V+0.6 V)/2, or 0.9V is achieved. This high common-mode voltage is often desirable for DC communication. In addition, transmitter 600 can achieve a relatively high voltage swing with the configuration shown in FIG. 7A. Therefore, transmitter 600, configured as shown in FIGS. 7A and 7B, is well suited to DC coupling.

Dual-mode LVDS/CML transmitter 600 provides greater flexibility than that offered by a single-mode transmitter. For instance, AC coupling may be necessary for long-range communication. AC coupling may also offer the advantage of greater interoperability, which is facilitated by the presence of DC blocking capacitors at the receiver. This interoperability permits, for example, the use of independent voltage biasing at the transmitter and receiver. On the other hand, DC coupling may be preferable for short-range communication. DC coupling does not require the use of DC blocking capacitors, which can save significant area around the perimeter of a chip and remove restrictions on the data encoding. A dual-mode LVDS/CML transmitter, such as that shown in FIGS. 6A and 7A, performs well under both these conditions.

It will be understood that the embodiments shown in the figures and described herein are merely illustrative, and other variations will be obvious to one of ordinary skill in the art. For instance, the component values (e.g., resistances, voltages, etc.) were provided for ease of illustration, and actual values may vary depending on various factors such as transistor sizing and process. Likewise, the layout of these elements is also shown for the sake of illustration, and other configurations (e.g., the relative placement of PMOS and NMOS transistors) could easily be varied without deviating from the spirit of the invention. The receiver circuits shown were intended to demonstrate possible uses of the associated transmitters, but any other suitable receivers can be used.

Figure 8:
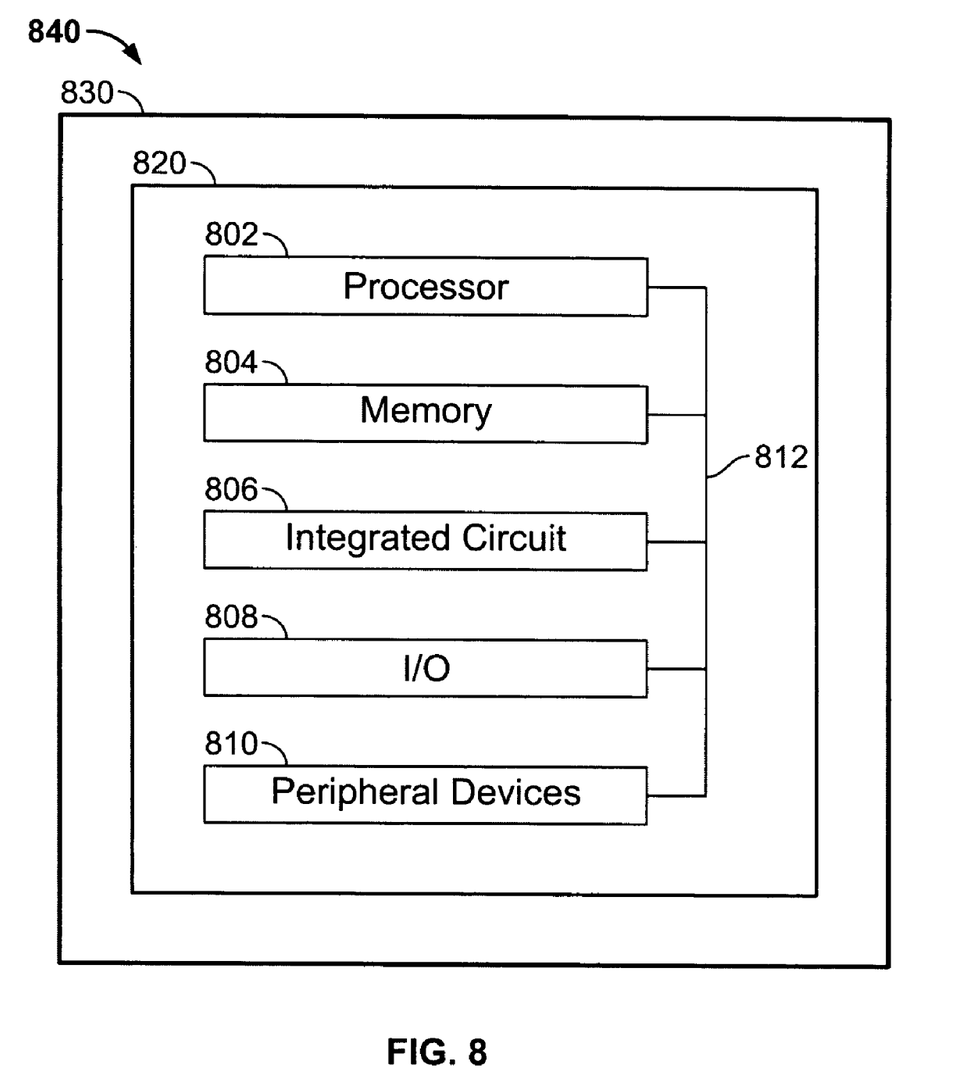
FIG. 8 is a block diagram of an illustrative data processing system incorporating the invention.

FIG. 8 illustrates an integrated circuit (IC) 806, which incorporates the dual-mode LVDS/CML transmitter of this invention, in a data processing system 840. Data processing system 840 may include one or more of the following components: processor 802; memory 804; I/O circuitry 808; and peripheral devices 810. These components are coupled together by a system bus 812 and are populated on a circuit board 820 which is contained in an end-user system 830.

System 840 can be used in a wide variety of applications, such as computer networking, data networking, instrumentation, video processing, or digital signal processing. IC 806 can be used to perform a variety of different logic functions. For example, IC 806 can be configured as a processor or controller that works in cooperation with processor 802. IC 806 may also be used as an arbiter for arbitrating access to a shared resource in system 840. In yet another example, IC 806 can be configured as an interface between processor 802 and one of the other components in system 840.

Thus it is seen that circuits and methods are provided for a dual-mode LVDS/CML transmitter. One skilled in the art will appreciate that the invention can be practiced by other than the described embodiments, which are presented for purposes of illustration and not of limitation, and the present invention is limited only by the claims which follow.

We claim:

1. Transmitter circuitry configured to produce from a pair of input signals a pair of output signals, the transmitter circuitry comprising:
    a first voltage source;
    a second voltage source;
    a third voltage source;
    differential switching circuitry operative to produce the output signals in response to the input signals; and
    resistor circuitry coupled to the differential switching circuitry, wherein:
    a voltage of the first voltage source is higher than a voltage of the third voltage source;
    a voltage of the second voltage source is variable; and
    the transmitter circuitry is operative to select between:
    a) a first mode in which current is conducted from the first voltage source to the third voltage source, passing through the resistor circuitry and first and second portions of the switching circuitry, and
    b) a second mode in which current is conducted from the second voltage source to the third voltage source, passing through a portion of the resistor circuitry and the second portion of the switching circuitry without passing through the first portion of the switching circuitry.

2. The transmitter circuitry of claim 1, wherein, as part of selecting one of the first and second modes, the voltage of the second voltage source is changed.

3. The transmitter circuitry of claim 2, wherein the voltage of the second voltage source is changed by substantially doubling the voltage of the second voltage source.

4. The transmitter circuitry of claim 2, wherein the voltage of the second voltage source is changed by substantially halving the voltage of the second voltage source.

5. The transmitter circuitry of claim 1, further comprising:
    a first source of current, coupled to the first voltage source.

6. The transmitter circuitry of claim 5, wherein:
    the first source of current is further coupled to the differential switching circuitry; and
    selecting one of the first and second modes comprises deactivating the first portion of the switching circuitry, wherein the deactivating at least partially electrically decouples the first source of current from the resistor circuitry.

7. The transmitter circuitry of claim 5, further comprising:
    a second source of current, coupled to the third voltage source.

8. The transmitter circuitry of claim 7, wherein the second source of current comprises a source of variable current.

9. The transmitter circuitry of claim 8, wherein selecting one of the first and second modes comprises:
    changing the current produced by the source of variable current.

10. The transmitter circuitry of claim 9, wherein the changing the current comprises:
    substantially doubling the current produced by the source of variable current.

11. The transmitter circuitry of claim 9, wherein the changing the current comprises:
    substantially halving the current produced by the source of variable current.

12. The transmitter circuitry of claim 1, wherein the differential switching circuitry comprises:
    two PMOS transistors; and
    two NMOS transistors.

13. The transmitter circuitry of claim 12, wherein:
    current flows through at most one of the two PMOS transistors at a time; and
    current flows through at most one of the two NMOS transistors at a time.

14. An integrated circuit comprising the transmitter circuit of claim 1.

15. A printed circuit board comprising the integrated circuit of claim 14.

16. A data processing system, comprising the printed circuit board of claim 15.

17. A method of changing a mode of a transmitter circuit, the method comprising:
    changing the amount of voltage generated by a variable voltage supply;
    changing the amount of current generated by a variable current supply; and
    electrically decoupling the variable current supply from a voltage source, the variable voltage supply supplying its voltage to a first node in the transmitter circuit; and the voltage source, when not electrically decoupled, being electrically connected so that current can flow from the voltage source through the first node to the variable current supply.

18. The method of claim 17, wherein the electrically decoupling comprises:
    applying a voltage to at least one switching circuit such that the at least one switching circuit is rendered non-conductive.

19. The method of claim 18, wherein:
    the at least one switching circuit comprises at least one transistor; and
    the applying comprises applying an input voltage to at least one gate of the at least one transistor.

20. The method of claim 18, wherein:
    the at least one switching circuit is coupled between a current source and the first node; and
    the electrically decoupling the variable current source from the voltage source electrically decouples the current source from the first node.

21. Transmitter circuitry configured to produce from a pair of input signals a pair of output signals, the transmitter circuitry comprising:
    a first voltage source;
    a second voltage source;
    a third voltage source;
    differential switching circuitry operative to produce the output signals in response to the input signals; and
    resistor circuitry coupled to the differential switching circuitry, wherein:

a voltage of the first voltage source is higher than a voltage of the third voltage source;

a voltage of the second voltage source is variable; and the transmitter circuitry is operative to select between:

a) a first mode in which the output signals are transmitted using a low voltage differential signaling (LVDS) transmission standard; and b) a second mode in which the output signals are transmitted using a current mode logic (CML) transmission standard.

22. The transmitter circuitry of claim 21, wherein, as part of selecting one of the first and second modes, the voltage generated by the second voltage source is changed.

23. The transmitter circuitry of claim 21, wherein, as part of selecting one of the first and second modes, a current generated by a source of variable current is changed.

24. The transmitter circuitry of claim 21, wherein:

selecting one of the first and second modes comprises deactivating a portion of the differential switching circuitry.

* * * * *